(12) United States Patent
Li et al.

(10) Patent No.: US 9,979,414 B1
(45) Date of Patent: May 22, 2018

(54) METHODS FOR ACCELERATING HASH-BASED COMPRESSION AND APPARATUSES USING THE SAME

(71) Applicant: VIA Alliance Semiconductor Co., Ltd., Shanghai (CN)

(72) Inventors: Xiaoyang Li, Beijing (CN); Zongpu Qi, Beijing (CN); Zheng Wang, Beijing (CN); Mengchen Yang, Beijing (CN); Fangfang Wu, Beijing (CN); Shican Luo, Beijing (CN); Lei Meng, Shanghai (CN); Jin Yu, Shanghai (CN); Kuan-Jui Ho, New Taipei (TW); Lin Li, Beijing (CN)

(73) Assignee: VIA ALLIANCE SEMICONDUCTOR CO., LTD., Shanghai (CN)

( * ) Notice: Subject to any disclaimer, the term of this patent is extended or adjusted under 35 U.S.C. 154(b) by 0 days. days.

(21) Appl. No.: 15/673,736

(22) Filed: Aug. 10, 2017

(30) Foreign Application Priority Data

May 17, 2017 (CN) .......................... 2017 1 0347209

(51) Int. Cl.
*H03M 7/34* (2006.01)
*H03M 7/30* (2006.01)
*G06F 5/06* (2006.01)
*G06F 9/44* (2018.01)
*G06F 3/06* (2006.01)

(52) U.S. Cl.
CPC ........ *H03M 7/3084* (2013.01); *G06F 3/0613* (2013.01); *G06F 3/0656* (2013.01); *G06F 3/0673* (2013.01); *G06F 5/065* (2013.01); *G06F 9/444* (2013.01); *G06F 9/4498* (2018.02); *H03M 7/6023* (2013.01)

(58) Field of Classification Search
CPC . H03H 19/004; H03H 19/1245; G11C 27/026
USPC ......................................................... 341/172
See application file for complete search history.

(56) References Cited

U.S. PATENT DOCUMENTS

| | | | | |
|---|---|---|---|---|
| 4,558,302 A * | 12/1985 | Welch | ................ | H03M 7/3088 341/51 |
| 6,202,090 B1 * | 3/2001 | Simone | ............... | G06F 11/0709 709/213 |
| 7,743,235 B2 * | 6/2010 | Wolrich | ................ | G06F 9/3851 712/16 |
| 9,112,525 B1 * | 8/2015 | Sjoholm | ............. | H03M 7/6023 |
| 2006/0112222 A1 * | 5/2006 | Barrall | .................. | G06F 3/0607 711/114 |

(Continued)

*Primary Examiner* — Lam T Mai
(74) *Attorney, Agent, or Firm* — McClure, Qualey & Rodack, LLP

(57) ABSTRACT

The invention introduces a method for accelerating hash-based compression, performed in a compression accelerator, comprising: fetching a string to be compressed from a data buffer; storing instances corresponding to the string in an intermediary buffer; issuing a hash request to a hash matcher for each instance, issuing a data request to an LSM (longest string matcher) according to a first reply sent by the hash matcher, and updating a state, a match length and a match offset of the instance according to a second reply sent by the LSM; and outputting the result to a formatter according to the state, the match length and the match offset of each instance in the original order of the associated substrings that appeared in the string.

17 Claims, 10 Drawing Sheets

(56) References Cited

U.S. PATENT DOCUMENTS

2006/0248095 A1* 11/2006 Cozzani ............... H04L 45/00
2007/0266037 A1* 11/2007 Terry ................. G06F 3/0607

* cited by examiner

METHODS FOR ACCELERATING HASH-BASED COMPRESSION AND APPARATUSES USING THE SAME

CROSS REFERENCE TO RELATED APPLICATIONS

This application claims the benefit of China Patent Application No. 201710347209.9, filed on May 17, 2017, the entirety of which is incorporated by reference herein.

BACKGROUND

Technical Field

The present invention relates to a microprocessor, and in particular, to methods for accelerating hash-based compression and apparatuses using the same.

Description of the Related Art

The most complicated technology of a compression accelerator is the LSM (longest-prefix string matching). LSM methods can be categorized into those that are CAM (Content addressable Memory)-based and those that are hash-based. Hash-based string matching is usually optimized by reducing hash chains and/or using a lower-conflict hash function, whose optimization is conventionally realized in the software domain. However, the performance of software is typically worse than that of dedicated hardware. Therefore, what is needed are methods for accelerating hash-based compression performed in dedicated hardware and apparatuses using the same to overcome the aforementioned drawbacks.

BRIEF SUMMARY

An embodiment of the invention introduces a method for accelerating hash-based compression, performed in a compression accelerator, comprising: fetching a string to be compressed from a data buffer; storing instances corresponding to the string in an intermediary buffer, wherein each instance is associated with a sub string of the string and comprises a state, a match length and a match offset for the associated substring; issuing a hash request to a hash matcher for each instance, issuing a data request to an LSM (longest string matcher) according to a first reply sent by the hash matcher, and updating the state, the match length and the match offset of the instance according to a second reply sent by the LSM; and outputting the result to a formatter according to the state, the match length and the match offset of each instance in the original order of the associated substrings that appeared in the string, thereby enabling the formatter to compress the string accordingly.

An embodiment of the invention introduces an apparatus for accelerating hash-based compression, at least containing: an intermediary buffer; and an FSM (Finite-State Machine) coupled to the intermediary buffer. The intermediary buffer stores instances corresponding to a string to be compressed that is stored in a data buffer and each instance is associated with a substring of the string and comprises a state, a match length and a match offset for the associated substring. The FSM issues a hash request to a hash matcher for each instance, issues a data request to an LSM according to a first reply sent by the hash matcher, and updates the state, the match length and the match offset of the instance according to a second reply sent by the LSM; and outputs the result to a formatter according to the state, the match length and the match offset of each instance in the original order of the associated substrings that appeared in the string, thereby enabling the formatter to compress the string accordingly.

The aforementioned FSM of the invention can output multiple hash requests to multiple hash functions in parallel at one clock cycle to trigger multiple hash matches. In addition, with the recordings of states, match lengths and match offsets in the intermediary buffer that are introduced by the invention, the raw string can be compressed in the original order based on out-of-order calculation results of hash matches and LSMs corresponding to the recorded instances.

A detailed description is given in the following embodiments with reference to the accompanying drawings.

BRIEF DESCRIPTION OF THE DRAWINGS

The present invention can be fully understood by reading the subsequent detailed description and examples with references made to the accompanying drawings, wherein.

DETAILED DESCRIPTION

The following description is of the best-contemplated mode of carrying out the invention. This description is made for the purpose of illustrating the general principles of the invention and should not be taken in a limiting sense. The scope of the invention is best determined by reference to the appended claims.

The present invention will be described with respect to particular embodiments and with reference to certain drawings, but the invention is not limited thereto and is only limited by the claims. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

Figure 1:
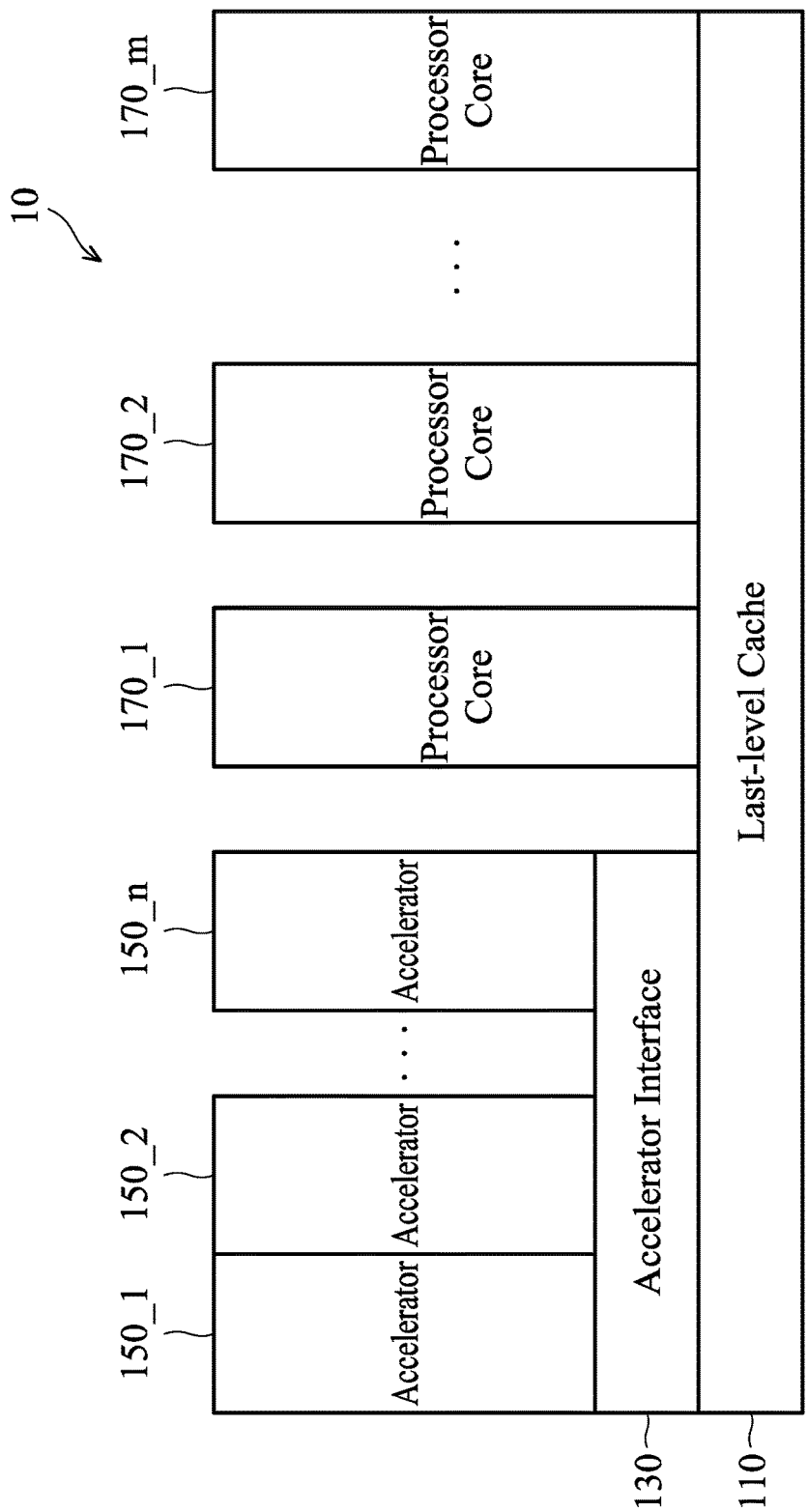
FIG. 1 is a system diagram of a microprocessor according to an embodiment of the invention.

FIG. 1 is a system diagram of a microprocessor according to an embodiment of the invention. A microprocessor 10 may contain processor cores 170_1 to 170_j and accelerators 150_1 to 150_i, where i and j are integers and may be set depending on different design requirements. The accelerators 150_1 to 150_i, for example, may be AFUs (Accelerator Functional Units). Components of any of the processor cores 170_1 to 170_j participate in the execution of computer instructions, such as an ALU (Arithmetic Logic Unit), a FPU (Floating Point Unit), a L1 cache and a L2 cache. An instruction cycle (sometimes called a fetch-decode-execute cycle) being the basic operational process is employed in each processor core. It is the process by which a processor core retrieves a program instruction from its memory, determines what operation the instruction indicates, and executes those operations. The accelerators 150_1 to 150_i may perform different functions and connect to a last-level cache 110 via an accelerator interface 130 to exchange data with the processor cores 170_1 to 170_j using virtual addresses. Any of the accelerators 150_1 to 150_i assists the processor cores 170_1 and 170_j to perform designated functions with heavy computation loading more efficiently, such as compression, ciphering/deciphering, regular matching or the like, thereby reducing the workload on the processor cores 170_1 to 170_j. One of the accelerators 150_1 to 150_i is a compression accelerator to complete a string compression.

Figure 2:
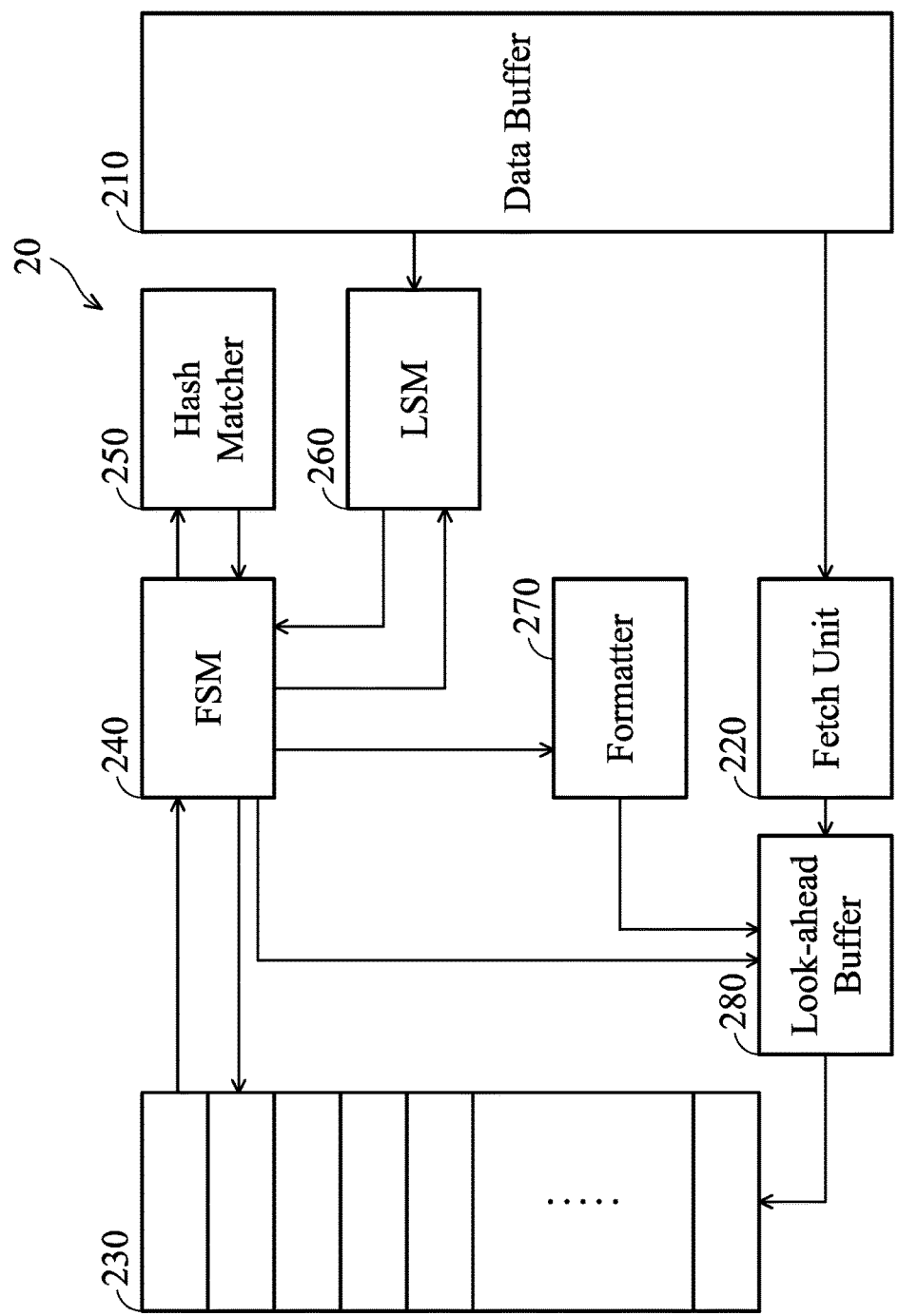
FIG. 2 is a block diagram of a compression accelerator according to an embodiment of the invention.

FIG. 2 is a block diagram of a compression accelerator according to an embodiment of the invention. A compression accelerator 20 contains a data buffer 210 and the length of the data buffer 210 may be 1024 M bytes for storing a raw string and a compressed string. It should be noted that, in alternative embodiments, the data buffer 210 may be located in the last-cache 110 as shown in FIG. 1; that is, the data buffer 210 may be located outside of the compression accelerator 20. A fetch unit 220 issues a look-ahead request to the data buffer 210 to fetch a fixed length of the raw string to be compressed, such as 16 bytes, and stores the fetched string in a look-ahead buffer 280 as the subject to be compressed. Characters of the string to be compressed are stored in an intermediary buffer 230 in order. The intermediary buffer 230 stores information regarding hashed and longest-string-matched results associated with each character. Specifically, the intermediary buffer 230 is segmented into multiple segments of memory spaces and each segment is used to store information of an instance. Each instance contains several fields for recording an index, a character, a state, a match offset, a match length or others. Since the compression accelerator 20 contains many parallel computations, the computation time (or referred to as clock cycles) for each instance cannot be predicted; that is, the computation result of a later instance may be generated earlier than that of a former one. Therefore, embodiments of the invention introduce the intermediate buffer 230 to make sure that the output sequence of the computation results of all instances is consistent with the original order of the characters to be compressed, and accordingly complete the longest-string-matching. The intermediary buffer 230 further contains an issuance pointer and a retirement pointer to point to an instance that needs to issue a hash request and an instance to be retired, respectively. Initially, the fetch unit 220 fetches multiple characters to be compressed from the raw string of the data buffer 210 and stores the characters in the instances of the intermediary buffer 230 in order. An FSM (Finite-State Machine) 240 may issue a hash request to a hash matcher 250 for an instance to obtain information indicating whether a string with a length of n that is associated with the instance can match one hash key of a hash table. In some embodiments, n is 3 or greater. The FSM 240 may further issue a data request to an LSM (longest string matcher) 260 for an instance to obtain the length of the original string of a sliding window of the data buffer 210 that can be matched following of the string of the instance. It should be noted that the string of the sliding window is located before the original string to be compressed within the intermediary buffer 230; that is, the string of the sliding window is the string that has been compressed. The FSM 240 may be implemented in fixed functions of PLD (Programmable Logic Device), PLC (Programmable Logic Controller), FPGA (Field Programmable Gate Array) or ASIC (Application-Specific Integrated Circuit) to complete the controls described in the embodiments of the invention.

Figure 3:
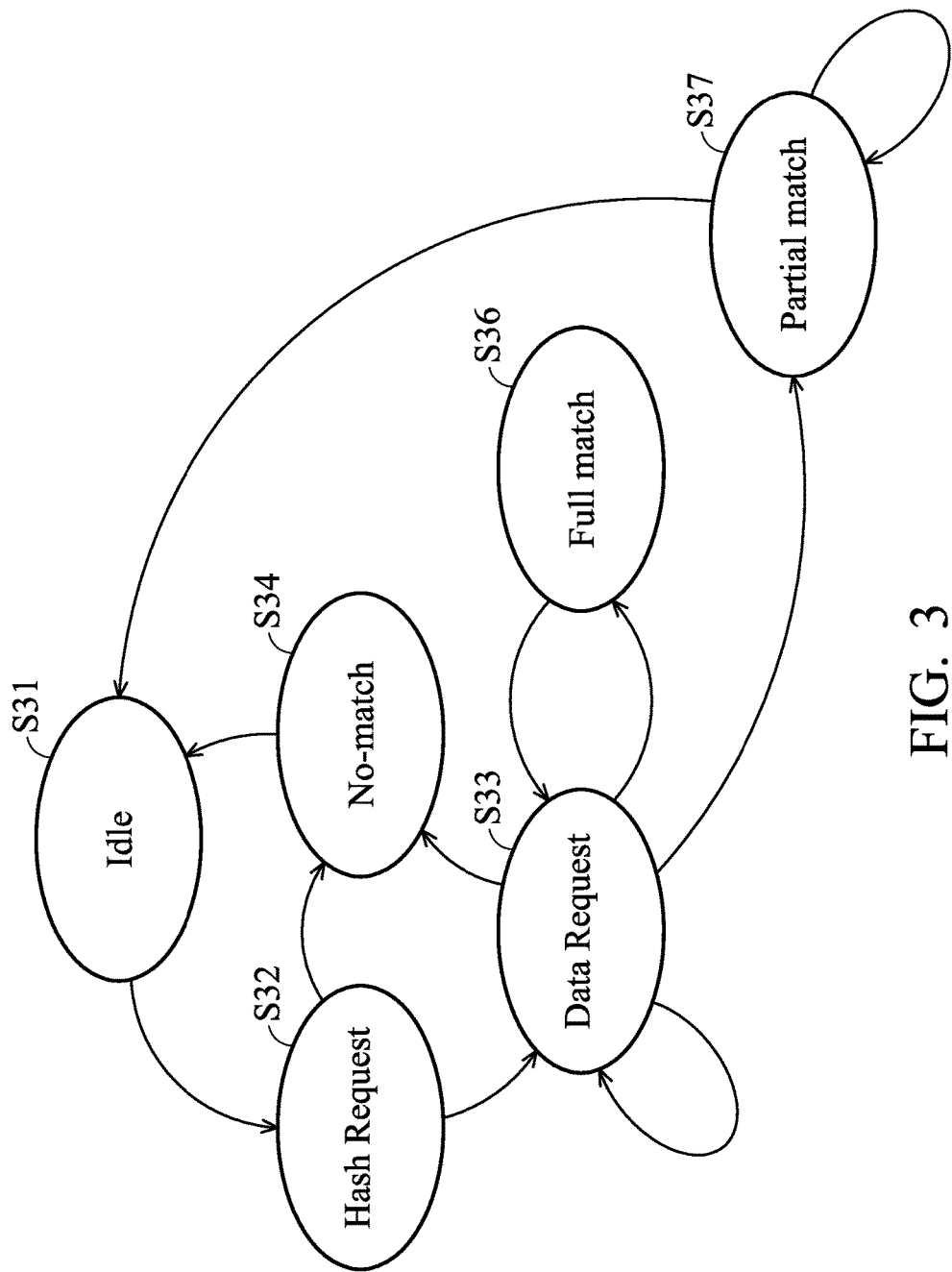
FIG. 3 is a state diagram according to an embodiment of the invention.

FIG. 3 is a state diagram according to an embodiment of the invention. Initially, the fetch unit 220 fetches multiple characters to be compressed from the raw string of the data buffer 210 and stores the characters in the instances of the intermediary buffer 230 in order. For example, the fetch unit 220 fetches a string "abcdxyzefgaf" and stores characters thereof in the intermediary buffer 230 in order. A state of each instance is initiated as an idle state S31 and the idle state S31 may be represented in null value. Table 1 shows initiated results for the instances:

TABLE 1

| Index | Character | State | Match Length (len) | Match Offset |
|---|---|---|---|---|
| 0 | a | / | | |
| 1 | b | / | | |
| 2 | c | / | | |
| 3 | d | / | | |
| 4 | x | / | | |
| 5 | y | / | | |
| 6 | z | / | | |
| 7 | e | / | | |
| 8 | f | / | | |
| 9 | g | / | | |
| 10 | a | / | | |
| 11 | f | / | | |

The symbol "/" represents a null value.

Figure 4:
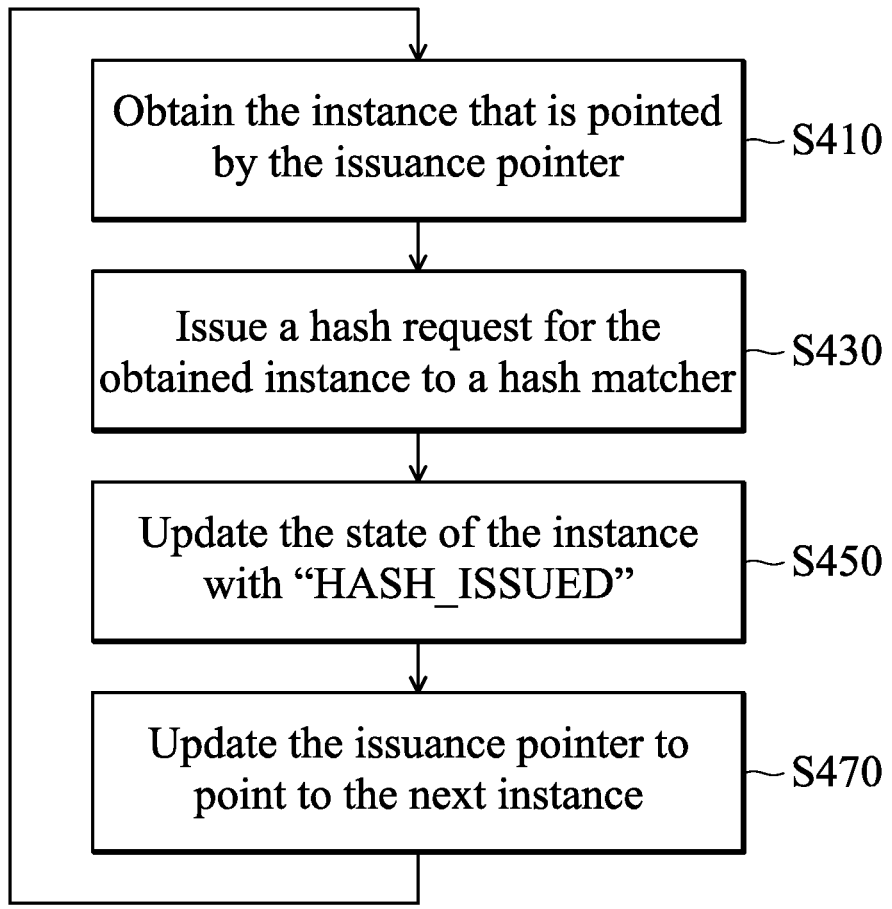
FIG. 4 is a flowchart of a hash request procedure according to an embodiment of the invention.

Methods for accelerating hash-based compression contain several procedures: a hash request procedure; a hash reply procedure; a data reply procedure; and a retirement procedure. The hash request and the retirement procedures are performed in parallel and have higher priorities than the others. FIG. 4 is a flowchart of a hash request procedure according to an embodiment of the invention. At each clock cycle, the FSM 240 obtains an instance that is pointed by the issuance pointer (step S410), issues a hash request for the obtained instance to a hash matcher 250 (step S430), updates the state of the instance with "HASH_ISSUED" to indicate that the instance enters a hash request state S32 (step S450) and updates the issuance pointer to point to the next instance (step S470). The hash request contains a string with a length n that has the character of the obtained instance followed by characters of subsequent instances. For example, the hash request corresponding to the instance 0 contains the string "abc", the hash request corresponding to the instance 1 contains the string "bcd", and so on. The string "abc" and "bcd" may be referred to as substrings of the raw string "abcdxyzefgaf".

Figure 5:
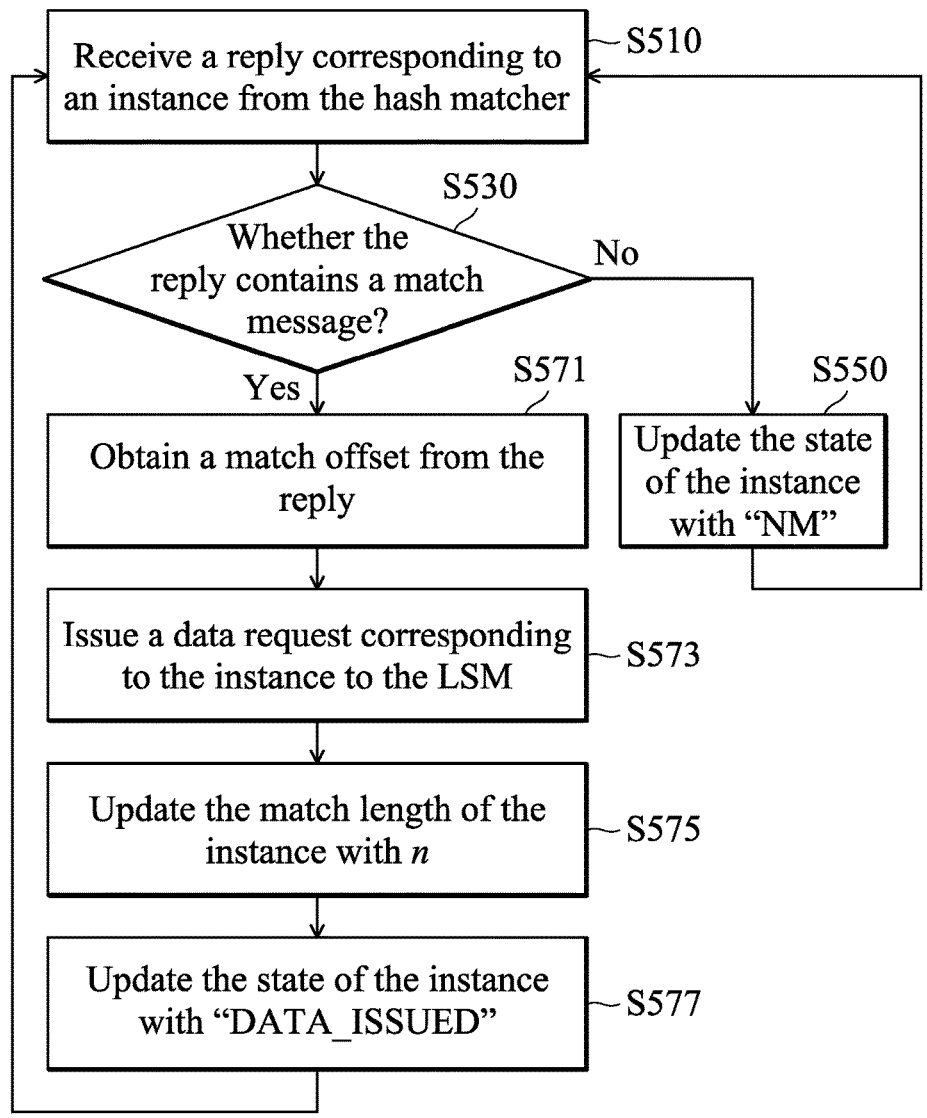
FIG. 5 is a flowchart of a hash reply procedure according to an embodiment of the invention.

FIG. 5 is a flowchart of a hash reply procedure according to an embodiment of the invention. After receiving a reply corresponding to an instance from the hash matcher 250

(step S510), the FSM 240 determines whether the reply contains a match message (step S530). When the reply contains a no-match message (the "No" path of step S530), the state of the instance is updated with "NM" to indicate that the instance enters a no-match state S34 (step S550). The reply received from the hash matcher 250 contains the requested string to make the FSM 240 recognize which instance is associated with the reply. When an instance enters the no-match state S34, the FSM 240 may recycle memory space of the instance at a future clock cycle for another instance to be produced. When the reply contains a match message (the "Yes" path of step S530), the FSM 240 obtains a match offset from the reply (step S571), issues a data request corresponding to the instance to the LSM 260 (step S573). The data request contains the obtained match offset, making the LSM 260 search the string of the sliding window of the data buffer 210 and obtain a longest-match length between the string of the sliding window starting with the obtained match offset and the string of the intermediary buffer 230 that starts with the character of the instance. After that, the match length of the instance is updated with n (step S573) and the state of the instance is updated with "DATA ISSUED" to indicate that the instance enters a data request state S33 (step S577). For example, after 7 clock cycles, the FSM 240 updates the instance states of the intermediary buffer 230 according to the replies from the hash matcher 250 and the LSM 260 as follows:

TABLE 2

| Index | Character | State | Match Length (len) | Match Offset |
| --- | --- | --- | --- | --- |
| 0 | a | NM | | |
| 1 | b | HASH_ISSUED | | |
| 2 | c | NM | | |
| 3 | d | NM | | |
| 4 | x | DATA_ISSUED | 3 | 1000 |
| 5 | y | NM | | |
| 6 | z | NM | | |
| 7 | e | / | | |
| 8 | f | / | | |
| 9 | g | / | | |
| 10 | a | / | | |
| 11 | f | / | | |

Table 2 shows hash requests corresponding to the instances 0 to 6 has been issued to the hash matcher 250. The FSM 240 has received replies corresponding to the instances 0, 2-3 and 5-6 that contain no-match (NM) messages. That is, the hash matcher 250 finds no-match for the strings "abc", "cdx", "dxa", "dxy", "yze" and "zef" corresponding to the instances 0, 2-3 and 5-6. In other words, the strings are not present in the raw string of the sliding window of the data buffer 210. In addition, the FSM 240 has received a reply corresponding to the instance 4 that contains a match message from the hash matcher 250, has issued a data request to the LSM 260 and hasn't received any reply from the LSM 260. The hash matcher 250 finds a match for the string "xyz" corresponding to the instance 4; that is, the string "xyz" is present in the string of the sliding window of the data buffer 210. The FSM 240 obtains a match offset of the sliding window for the string "xyz" of the instance 4 and issues a data request comprising the match offset to the FSM 260, making the LSM 260 search the string of the sliding window of the data buffer 210 and obtain a longest-match length between the string of the sliding window that starts with the match offset 1000 and the string of the intermediary buffer 230 that starts with "xyz". In addition, the FSM 240 hasn't received any reply corresponding to the instance 1 from the hash matcher 250. It should be noted that, in alternative embodiments, after obtaining the match offset corresponding to an instance from the reply (step S571), the FSM 240 issues a data request corresponding to the instance to the LSM 260 (step S573) but does not update the content of the instance of the intermediary buffer 230 (that is, does not execute steps S575 and S577).

Figure 6:
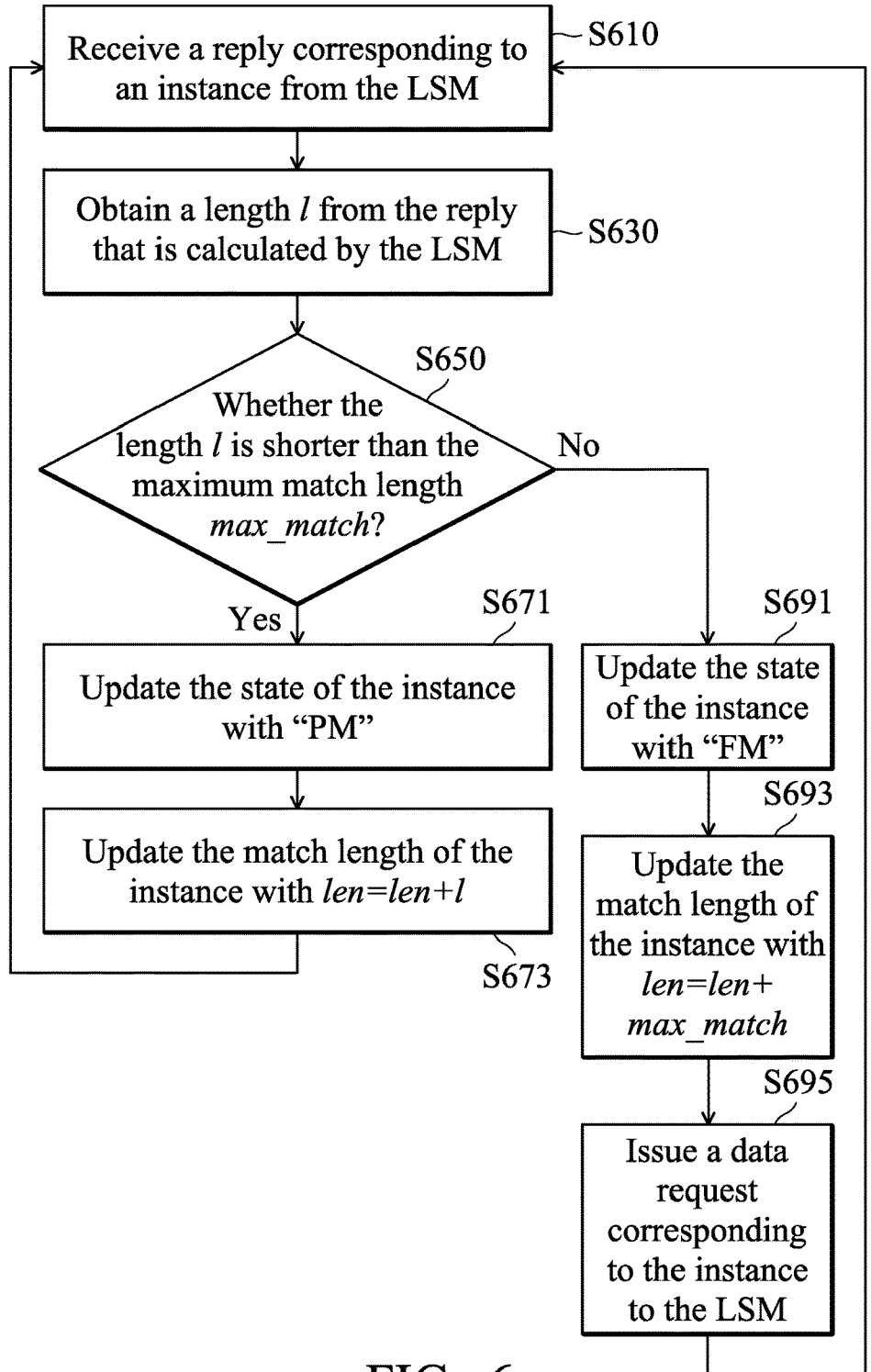
FIG. 6 is a flowchart of a data reply procedure according to an embodiment of the invention.

FIG. 6 is a flowchart of a data reply procedure according to an embodiment of the invention. When receiving a reply corresponding to an instance from the LSM 260 (step S610), the FSM 240 obtains a length l from the reply that is calculated by the LSM 260 (step S630) and determines whether the length l is shorter than the maximum match length max_match (step S650). When the length l is shorter than the maximum match length max_match (the "Yes" path of step S650), the state of the instance is updated with "PM" to indicate that the instance enters a partial match state S37 (step S671) and a match length of the instance is updated with len=len+l (step S673). When an instance enters the partial match state S37, the FSM 240 may recycle memory space of the instance at a future clock cycle for another instance to be produced. When the length l is not shorter than (usually equals) the maximum match length max_match (the "No" path of step S650), the state of the instance is updated with "FM" to indicate that the instance enters a full match state S36 (step S691), a match length of the instance is updated with len=len+max_match (step S693), and a further data request corresponding to the instance is issued to the LSM 260 for continuing to match the following string (step S695). It should be understood that if the step for updating the content of the instance of the intermediary buffer 230 as shown in FIG. 5 is omitted, the match length is updated with len=len+l+n as shown in FIG. 6 instead, where n is the length of the substring corresponding to the instance.

Figure 7:
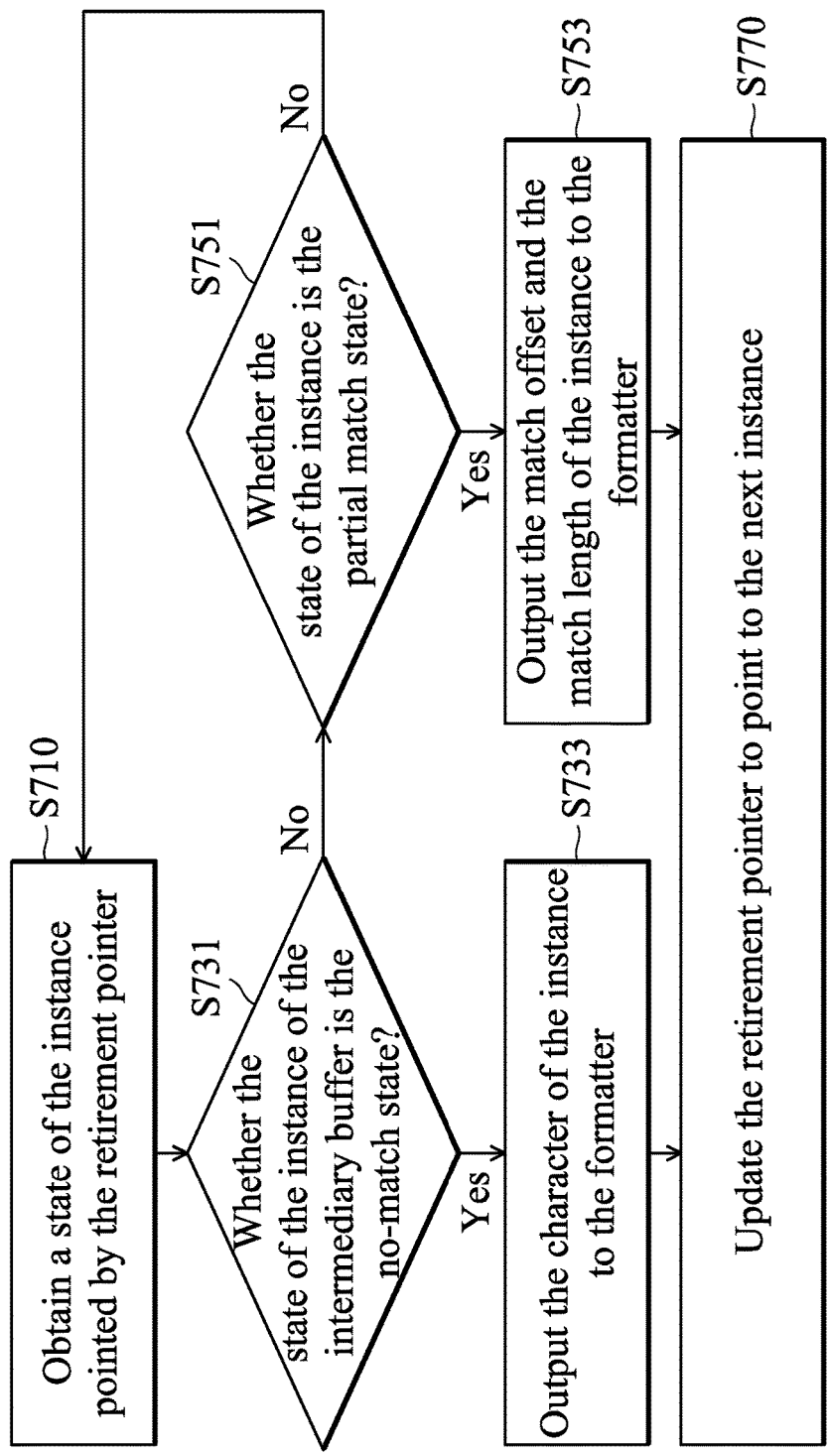
FIG. 7 is a flowchart of a retirement procedure according to an embodiment of the invention.

In one clock cycle, the FSM 240 not only perform the hash request procedure but also the retirement procedure. FIG. 7 is a flowchart of a retirement procedure according to an embodiment of the invention. In each clock cycle, the FSM 240 obtains a state of the instance pointed by the retirement pointer (step S710), determines whether the state of the instance of the intermediary buffer 230 is the no-match state (step S731). When the state is the no-match state (the "Yes" path of step S731), the character of the instance is output to a formatter 270 to enable the formatter 270 to compress the raw string of the look-ahead buffer 280 accordingly (step S733), the state of the instance is updated with the null value and the retirement pointer is updated to point to the next instance for retiring the instance, enabling memory space of the instance can be provided for a future pushed instance (step S770). When the state of the instance is not the no-match state (the "No" path of step S731), it is determined whether the state of the instance is the partial match state (step S751). When the state of the instance is the partial match state (the "Yes" path of step S751), the match offset and the match length of the instance is output to the formatter 270 to enable the formatter 270 to compress the raw string of the look-ahead buffer 280 accordingly (step S753), the state of the instance is updated with the null value and the retirement pointer is updated to point to the next instance for retiring the instance, enabling memory space of the instance can be provided for a future pushed instance (step S770). The formatter 270 may use LZ4, LZO (Lempel-Ziv-Oberhumer), DEFLATE, or other algorithms to compress the raw string. When the state is neither no-match state nor partial match state (the "No" path of step S751), it means a full match and the FSM 240 issues a further data request corresponding to the instance to the LSM 260 for continuing to compare the following string as illustrated in step S691 of FIG. 6 and does not perform any retirement for the instance. The "No" path of step S751 of FIG. 7 is connected to step S710 and the FSM 240 waits for a future update of the state of the instance. In general, the FSM 240 performs the retirement procedure as shown in FIG. 7 according to an original order of the sub strings stayed in the raw string, which correspond to the instances; that is, the movement of the retirement pointer follows the original order, and outputs results to the formatter 270 according to the states, match lengths and match offsets of the instances of the intermediary buffer 230 (will be illustrated with Tables 3 to 5 as follows), enabling the formatter 270 to compress the raw string accordingly. Details will be described in the following with references made to Tables 3 to 5.

What follows are the cases shown in Table 2. Assume that, at clock cycle $c_7$, the issuance pointer points to the instance 7, the retirement pointer points to the instance 0, the maximum match length max_match is preset to 16, and the FSM 240 receives a reply corresponding to the instance 4 from the LSM 260: Refer to FIG. 4. At this clock cycle, the FSM 240 obtains the instance 7 pointed by the issuance pointer (step S410), issues a hash request that contains the string "efg" to the hash matcher 250 for the instance 7 (step S430), updates the state of the instance 7 with "HASH_ISSUED" to indicate that the instance 7 enters the hash request state S32 (step S450) and updates the issuance pointer to point to the instance 8 (step S470). Refer to FIG. 7. The FSM 240 obtains the state of the instance 0 pointed by the retirement pointer (step S710). Since the state of the instance 0 is NM, the FSM 240 outputs the character "a" of the instance 0 to the formatter 270, enabling the formatter 270 to compress the raw string of the look-ahead buffer 280 accordingly (step S733). Specifically, since the state of the instance 0 is NM, the character "a" maintains the original state and not to be compressed, and the sliding window of the data buffer 210 slides forward by one character. That is, the character "a" of the data buffer 210 is entered into the sliding window to become a part of a new dictionary. After that, the state of the instance 0 is updated with a null value "/" and the retirement pointer is updated to point to the instance 1 (step S770). Refer to FIG. 6. At this clock cycle, the FSM 240 receives a length l=2 calculated by the LSM 260 from a reply corresponding to the instance 4 (step S630). Since l<max_match, the state of the instance 4 is updated with "PM" to indicate that the instance 4 enters the partial match state S37 (step S671) and the match length of the instance 4 is updated with len=3+2=5 (step S673). The instance states of the intermediary buffer 230 is updated as the following Table 3:

TABLE 3

| Index | Character | State | Match Length (len) | Match Offset |
|---|---|---|---|---|
| 0 | a | / | | |
| 1 | b | HASH_ISSUED | | |
| 2 | c | NM | | |
| 3 | d | NM | | |
| 4 | x | PM | 5 | 1000 |
| 5 | y | NM | | |
| 6 | z | NM | | |
| 7 | e | HASH_ISSUED | | |
| 8 | f | / | | |
| 9 | g | / | | |
| 10 | a | / | | |
| 11 | f | / | | |

What follows are the cases shown in Table 3. Assume that, at clock cycle $c_8$, the FSM 240 receives a reply corresponding to the instance 1 from the hash matcher 250: Refer to FIG. 4. At this clock cycle, the FSM 240 obtains the instance 8 that is pointed by the issuance pointer (step S410), issues a hash request that contains the string "fga" to the hash matcher 250 for the instance 8 (step S430), updates the state of the instance 8 with "HASH_ISSUED" to indicate that the instance 8 enters the hash request state S32 (step S450) and updates the issuance pointer to point to the instance 9 (step S470). Refer to FIG. 7. The FSM 240 obtains the state of the instance 1 pointed by the retirement pointer (step S710). Since the state of the instance 1 is HASH_ISSUED, the FSM 240 does nothing. Refer to FIG. 5. At this clock cycle, the FSM 240 receives a reply from the hash matcher 250 corresponding to the instance 1 (step S510). Since that the reply contains a no-match message, the state of the instance 1 is updated with "NM" to indicate that the instance 1 enters the no-match state S34 (step S550). The instance states of the intermediary buffer 230 is updated as the following Table 4:

TABLE 4

| Index | Character | State | Match Length (len) | Match Offset |
|---|---|---|---|---|
| 0 | a | / | | |
| 1 | b | NM | | |
| 2 | c | NM | | |
| 3 | d | NM | | |
| 4 | x | PM | 5 | 1000 |
| 5 | y | NM | | |
| 6 | z | NM | | |
| 7 | e | HASH_ISSUED | | |
| 8 | f | HASH_ISSUED | | |
| 9 | g | / | | |
| 10 | a | / | | |
| 11 | f | / | | |

What follows are the cases shown in Table 4. Assume that, at clock cycle $c_9$, the FSM 240 receives a reply corresponding to the instance 7 from the hash matcher 250: Refer to FIG. 4. At this clock cycle, the FSM 240 obtains the instance 9 pointed by the issuance pointer (step S410), issues a hash request that contains the string "gaf" to the hash matcher 250 for the instance 9 (step S430), updates the state of the instance 9 with "HASH_ISSUED" to indicate that the instance 9 enters the hash request state S32 (step S450) and updates the issuance pointer to point to the instance 10 (step S470). Refer to FIG. 7. The FSM 240 obtains the state of the instance 1 pointed by the retirement pointer (step S710). Since the state of the instance 1 is NM, the FSM 240 outputs the character "b" of the instance 1 to the formatter 270, enabling the formatter 270 to compress the raw string of the look-ahead buffer 280 accordingly (step S733). Specifically, since the state of the instance 1 is NM, the character "b" maintains the original state and not to be compressed, and the sliding window of the data buffer 210 slides forward by one character. That is, the character "b" of the data buffer 210 is entered into the sliding window to become a part of a new dictionary. After that, the state of the instance 1 is updated with a null value "/" and the retirement pointer is updated to point to the instance 2 (step S770). Refer to FIG. 5. At this clock cycle, the FSM 240 receives a reply corresponding to the instance 7 from the hash matcher 250 (step S510). Since the reply contains a no-match message, the state of the instance 7 is updated with "NM" to indicate that the instance 7 enters the no-match state S34 (step S550). The instance states of the intermediary buffer 230 are updated as per the following Table 5:

TABLE 5

| Index | Character | State | Match Length (len) | Match Offset |
|---|---|---|---|---|
| 0 | a | / | | |
| 1 | b | / | | |
| 2 | c | NM | | |
| 3 | d | NM | | |
| 4 | x | PM | 5 | 1000 |
| 5 | y | NM | | |
| 6 | z | NM | | |
| 7 | e | NM | | |
| 8 | f | HASH_ISSUED | | |
| 9 | g | HASH_ISSUED | | |
| 10 | a | / | | |
| 11 | f | / | | |

Refer to FIG. 7. Suppose that, after a period of time has elapsed, the FSM 240 obtains the state of the instance 4 pointed by the retirement pointer (step S710). It should be noted that, before this moment, the characters "c" and "d" of the raw string of the look-ahead buffer 280 are no-match and are not compressed. In addition, the characters "c" and "d" have been entered into the sliding window to become a part of a new dictionary. At this clock cycle, since the state of the instance 4 is PM, the FSM 240 outputs the match offset offset=1000 and the match length len=5 to the formatter 270, enabling the formatter 270 to compress the raw string of the look-ahead buffer 280 accordingly (step S753). Since the state of the instance 4 is PM and its match length len=5, the string "xyzef" is replaced with (offset, len), that is (1000, 5) and the sliding window of the data buffer 210 slides forward by 5 characters; that is, the string "xyzef" of the data buffer 210 are entered into the sliding window to become a part of a new dictionary.

As shown in the above examples, the FSM 240 issues corresponding hash requests according to the order of instances to activate compression procedures. It should be noted that when the hash matcher 250 and the LSM 260 compute for each instance is not predictable, which is caused by, for example, the parallel mapping of the hash matcher 250 as described in FIG. 8, resulting these instances not being able to enter the no match state S34 or the partial match state S37 following the original order. Although these instances cannot be able to enter the no match state S34 or the partial match state S37 following the original order, by the aforementioned embodiments of the compression procedures, the FSM 240 can output the computation results of the hash matcher 250 and the LSM 260 to the formatter 270 in the original order of the instances with the aid of the retirement pointer.

Figure 8:
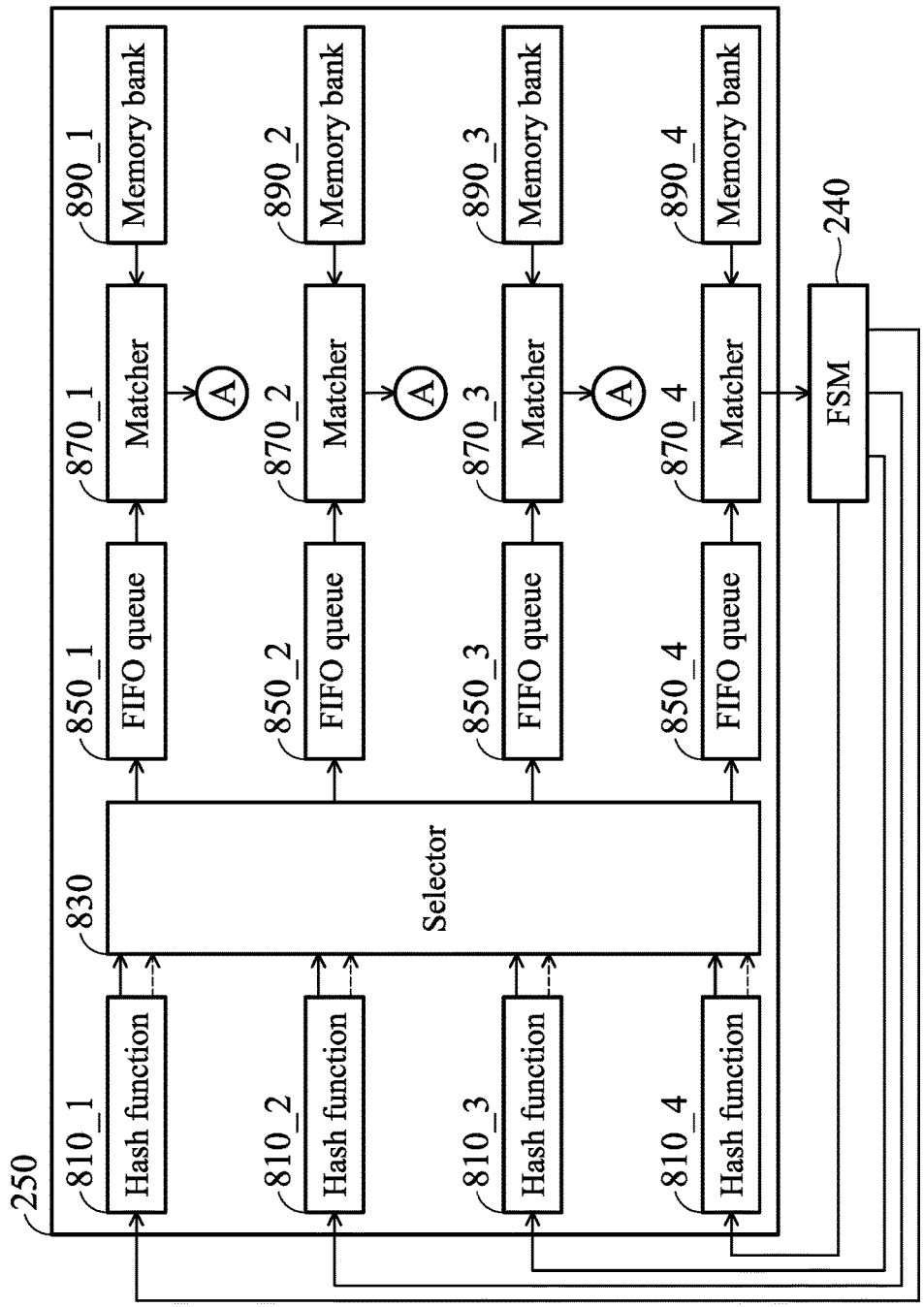
FIG. 8 is a block diagram of a hash matcher according to an embodiment of the invention.

FIG. 8 is a block diagram of a hash matcher according to an embodiment of the invention. To accelerate hash matches, a hash matcher may contain multiple match paths in parallel and each match may contain a FIFO (First-In-First-Out) queue, a matcher and a memory bank. For example, a first match path contains a FIFO queue 850_1, a matcher 870_1 and a memory bank 890_1, a second match path contains a FIFO queue 850_2, a matcher 870_2 and a memory bank 890_2, and so on. Any of the hash functions 810_1 to 810_4 maps a sub string sent by the FSM 240 to a hash index, directs a selector 830 to connect to one of the match paths according to the hash index and transmits the sub string to the connected match path. When determining that a hash table does not contain the substring, the connected match path transmits a no-match message to the FSM 240. When determining that the hash table contains the substring (that is, the substring exists in the sliding window of the data buffer 210), the connected match path transmits a match message and a match offset of the hash table corresponding to the substring to the FSM 240. For example, when the hash table contains the substring "xyz" corresponding to the instance 4, that means the substring "xyz" exists in the sliding window of the data buffer 210. Although four match paths are described as examples in the embodiments of the invention, those skilled in the art may dispose more or fewer match paths in the hash matcher 250 according to different design requirements and the invention should not be limited thereto. The hash table is distributed in the four memory banks 870_1 to 870_4. The memory banks 870_1 to 870_4 may be implemented in a cache. The hash table contains N entries. The memory bank 870_1 stores the $0^{th}$ to the $(N/4-1)^{th}$ entries, the memory bank 870_2 stores the $(N/4)^{th}$ to the $(N/2-1)^{th}$ entries, the memory bank 870_3 stores the $(N/2)^{th}$ to the $(3N/4-1)^{th}$ entries and the memory bank 870_4 stores the $(3N/4)^{th}$ to the $(N-1)^{th}$ entries. That is, the hash table is distributed according to significant two bits of addresses. In alternative embodiments, the hash table may be distributed according to the least two bits or other two bits of addresses. In some embodiments, each entry may contain related information regarding multiple (e.g. 3) hash keys and the hash keys have the same hash index to form a hash chain. For example, when n is 3 and each entry stores data using 16 bytes, the exemplary data structure is shown in Table 6:

TABLE 6

| Address | Name | Description |
|---|---|---|
| Byte[0] | Tag | Tag |
| Byte[1:3] | Hash_Key_1 | First hash key |
| Byte[4:5] | Hash_Offset_1 | First hash offset |
| Byte[6:8] | Hash_Key_2 | Second hash key |
| Byte[9:10] | Hash_Offset_2 | Second hash offset |
| Byte[11:13] | Hash_Key_3 | Third hash key |
| Byte[14:15] | Hash_Offset_3 | Third hash offset |

The $0^{th}$ byte of each entry stores a tag in 3 bits of a fixed location to indicate whether each of three hash keys of the entry is valid. For example, "2'b100" indicates that the first hash key is valid and the second and third hash keys are invalid, "2'b110" indicates that the first and second hash keys are valid and the third hash key is invalid, and so on. The $1^{st}$ to $3^{rd}$ bytes of each entry stores the first hash key "Hash_Key_1" corresponding to a hash index to indicate that the raw string of the sliding window contains a substring corresponding to the first hash key "Hash_Key_1". The $4^{th}$ and $5^{th}$ bytes of each entry stores the first hash offset "Hash_Offset_1" corresponding to the first hash key "Hash_Key_1" to indicate an offset of the sub string corresponding to the first hash key "Hash_Key_1" that exists in the raw string of the sliding window. The $6^{th}$ to $8^{th}$ bytes of each entry stores the second hash key "Hash_Key_2" corresponding to the same hash index to indicate that the raw string of the sliding window contains a substring corresponding to the second hash key "Hash_Key_2". The $9^{th}$ and $10^{th}$ bytes of each entry stores the second hash offset "Hash_Offset_2" corresponding to the second hash key "Hash_Key_2" to indicate an offset of the substring corresponding to the second hash key "Hash_Key_2" that exists in the raw string of the sliding window. The $11^{th}$ to $13^{th}$ bytes of each entry stores the third hash key "Hash_Key_3" corresponding to the same hash index to indicate that the raw string of the sliding window contains a substring corresponding to the third hash key "Hash_Key_3". The $14^{th}$ and $15^{th}$ bytes of each entry stores the third hash offset "Hash_Offset_3" corresponding to the third hash key "Hash_Key_3" to indicate an offset of the substring corresponding to the third hash key "Hash_Key_3" that exists in the raw string of the sliding window. Those skilled in the art may modify the content of each entry to store more or fewer hash keys and the related hash offsets according to different design requirements and the invention should not be limited thereto.

To accelerate hash matches, the hash matcher 250 may contain four hash functions 810_0 to 810_3 performing the same hash algorithm in parallel for mapping any substring to a hash index of a fixed length. The length of the hash index is shorter than that of the substring. The FSM 240 outputs four hash requests to hash functions 810_1 to 810_4 simultaneously at the same clock cycle in a 4-issue way. Any of the hash functions 810_1 to 810_4 directs a selector 830 to connect to one of FIFO (First-In-First-Out) queues 850_1 to 850_4 for pushing a hash request into the connected FIFO queue. For example, when mapping the substring "abc" to a hash index "0", the hash function 810_1 directs the selector 830 to connect to the FIFO queue 850_1 for pushing a hash request into the FIFO queue 850_1. It should be noted that the hash request contains the substring generated by the FSM 240 and the hash index generated by the corresponding hash function.

The hash matcher 250 may contain four parallel matchers 870_1 to 870_4. The matcher 870_1 is connected between the FIFO queues 850_1 and a memory bank 890_1, the matcher 870_2 is connected between the FIFO queues 850_2 and a memory bank 890_2, the matcher 870_3 is connected between the FIFO queues 850_3 and a memory bank 890_3 and the matcher 870_4 is connected between the FIFO queues 850_4 and a memory bank 890_4. Any of the matchers 870_1 to 870_4 acquires the earliest entered hash request from the connected FIFO queue, searches an entry conform to the hash index of the hash request from the connected memory bank and determines whether the entry contains a valid hash key by inspecting a tag of the found entry. When the entry does not contain a valid hash key, the matcher determines that the entry conform to the hash index of the hash request is not found and replies to the FSM 240 with a message that the substring of the hash request is no match. When the entry contains a valid hash key, the matcher further determines whether the valid hash key is the same as the substring of the hash request. When all valid hash keys of the entry are different from the substring of the hash request, the matcher replies to the FSM 240 with a message that the substring of the hash request is no match. When one valid hash key of the entry is the same as the substring of the hash request, the matcher replies to the FSM 240 with a message that the substring of the hash request is matched, and a hash offset is associated with the matched hash key.

Figure 9:
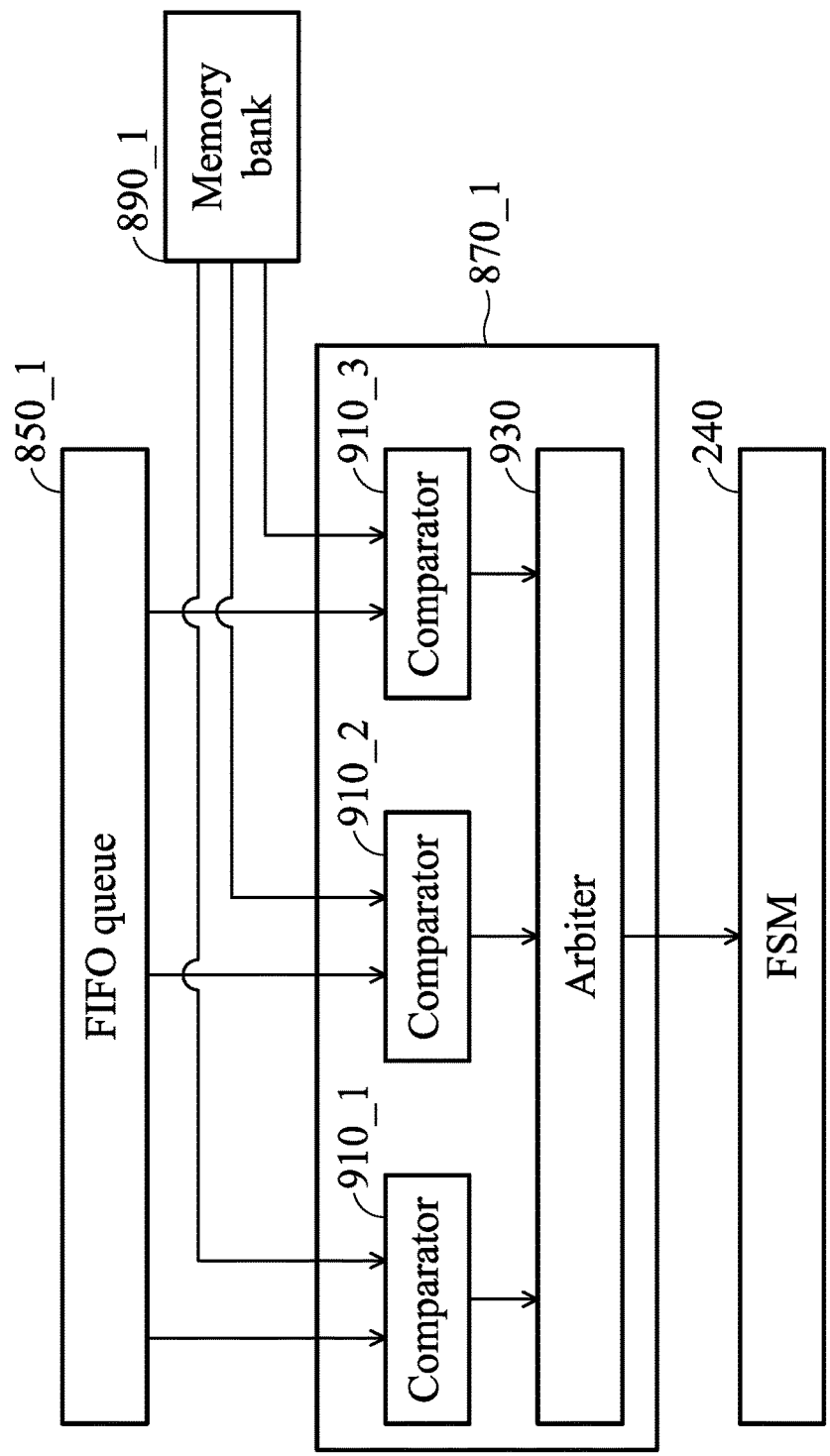
FIG. 9 is a block diagram of a matcher according to an embodiment of the invention.

FIG. 9 is a block diagram of a matcher according to an embodiment of the invention. Although embodiments of the invention only describe the matcher 870_1 as examples, those skilled in the art may deduce details of the matchers 870_2 to 870_4 by analogy. The matcher 870_1 contains a comparator 910_1 to 910_3 and an arbiter 930. The comparator 910_1 obtains a substring of a hash request from the FIFO queue 850_1 and a first hash key and a first hash offset from a corresponding entry of the memory bank 890_1 and determines whether the substring is the same as the first hash key. When the substring is the same as the first hash key, the comparator 910_1 outputs the first hash offset to the arbiter 930. The comparator 910_2 obtains the substring of the hash request from the FIFO queue 850_1 and a second hash key and a second hash offset from the corresponding entry of the memory bank 890_1 and determines whether the substring is the same as the second hash key. When the substring is the same as the second hash key, the comparator 910_2 outputs the second hash offset to the arbiter 930. The comparator 910_3 obtains the substring of the hash request from the FIFO queue 850_1 and a third hash key and a third hash offset from the corresponding entry of the memory bank 890_1 and determines whether the substring is the same as the third hash key. When the substring is the same as the third hash key, the comparator 910_3 outputs the third hash offset to the arbiter 930. When receiving no hash offset from the comparators 910_1 to 910_3, the arbiter 930 replies to the FSM 240 with a no-match message for the substring of the hash request. When receiving one hash offset from the comparators 910_1 to 910_3, the arbiter 930 replies to the FSM 240 with a match message and the received hash offset for the substring of the hash request. When receiving two or more hash offsets from the comparators 910_1 to 910_3, the arbiter 930 replies to the FSM 240 with a match message and the minimum of the received hash offsets for the substring of the hash request. For example, a substring "abc" of a hash request is mapped (or calculated) by the hash function 810_1 to a hash index "0" and an entry of the memory bank 890_1 that corresponds to the hash index "0" contains three hash keys and their hash offsets: the first hash key "abc" with the hash offset=50; the second hash key "xyz" with the hash offset=100; and the third hash key "abc" with the hash offset=200. It should be noted that, although the hash key "abc" is different from the hash key "xyz", the mapped (or calculated) hash indexes by the hash function 810_1 are the same. With the calculation rules adopted by the hash function 810_1, the hash indexes of the hash keys "abc" and "xyz" are both "0". Two identical hash keys "abc" appeared in the corresponding entry mean that two substrings "abc" appear in the raw string of the sliding window at different offsets. Since the first and third hash keys "abc" are the same as the substring "abc" of the hash request, the comparators 910_1 and 910_3 output the first hash offset=50 and the third hash offset=200 to the arbiter 930, respectively. The arbiter 930 replies to the FSM 240 with a match message and the minimum hash offset=50 for the substring "abc". It should be noted that, in some other embodiments, when two or more of the aforementioned matches appear in any hash table of a memory bank, the arbiter 930 replies to the FSM 240 with a match message and all received hash offsets for a substring of a hash request.

The aforementioned FSM 240 of the invention can output multiple hash requests to multiple hash functions in parallel at one clock cycle to trigger multiple hash matches. In addition, with the recordings of states, match lengths and match offsets in the intermediary buffer 230 that are introduced by the invention, the raw string can be compressed in the original order based on out-of-order calculation results of hash matches and LSMs corresponding to the recorded instances.

Figure 10:
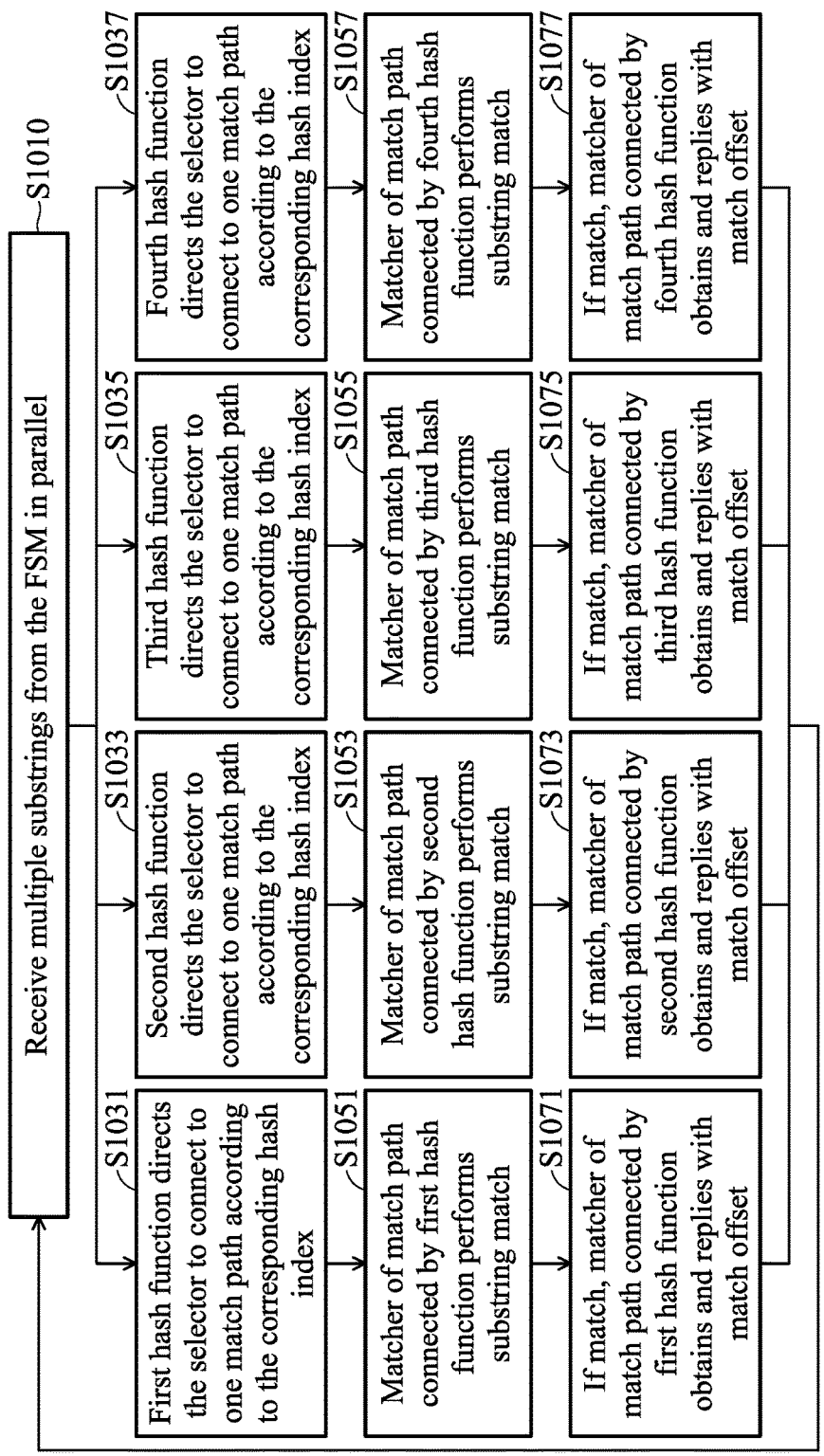
FIG. 10 is a flowchart of a method for performing hash matches according to an embodiment of the invention.

FIG. 10 is a flowchart of a method for performing hash matches according to an embodiment of the invention. The hash functions 810_1 to 810_4 receive multiple substrings from the FSM 240 in parallel (step S1010). Next, the hash function 810_1 maps the received substring to a hash index and directs the selector 830 to connect the hash function 810_1 to one of match paths according to the hash index (step S1031), the hash function 810_2 maps the received substring to a hash index and directs the selector 830 to connect the hash function 810_2 to one of match paths according to the hash index (step S1033), and so on. In should be noted that, in steps S1031, S1033, S1035 and S1037, two or more of the hash functions 810_1 to 810_4 may connect to the same match path and push hash requests including the received substrings into the FIFO queues of this match path. Next, when determining that the hash table does not contain the substring received by the hash function 810_1, a matcher (such as the matcher 870_1, 870_2, 870_3 or 870_4) of the match path connected by the hash function 810_1 transmits a no-match message to the FSM 240 (step S1051). When determining that the hash table contains the substring received by the hash function 810_1, a matcher (such as the matcher 870_1, 870_2, 870_3 or 870_4) of the match path connected by the hash function 810_1 transmits a match message and a match offset of the hash table to the FSM 240 where the match offset corresponds to the received substring (step S1071). When determining that the hash table does not contain the substring received by the hash function 810_2, a matcher (such as the matcher 870_1, 870_2, 870_3 or 870_4) of the match path connected by the hash function 810_2 transmits a no-match message to the FSM 240 (step S1053). When determining that the hash table contains the substring received by the hash function 810_2, a matcher (such as the matcher 870_1, 870_2, 870_3 or 870_4) of the match path connected by the hash function 810_2 transmits a match message and a match offset of the hash table to the FSM 240 where the match offset corresponds to the received substring (step S1073). Details of steps S1055, S1075, S1057 and S1077 may be deduced by analogy and are omitted for brevity. It should be noted that, when the FIFO queue of one match path contains two or more hash requests, the matcher of this match path performs the aforementioned determinations for the hash requests according to the arrival orders of the hash requests. For example, when the FIFO queue of one match path contains hash requests received from the hash functions 810_1 and 810_2 and the hash request from the hash function 810_1 arrives earlier than the hash function 810_2, steps S1031, S1051 and S1071 are performed earlier than steps S1033, S1053 and S1073.

Although the embodiments have been described as having specific elements in FIGS. 1, 2, 8 and 9, it should be noted that additional elements may be included to achieve better performance without departing from the spirit of the invention. While the process flows described in FIGS. 4-7 and 10 include a number of operations that appear to occur in a specific order, it should be apparent that those skilled in the art can modify the order to achieve the same objectives. Thus, the invention should not be limited to the specific order.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for accelerating hash-based compression, performed in a compression accelerator, comprising:
   fetching, by a fetch unit, a string to be compressed from a data buffer;
   storing a plurality of instances corresponding to the string in an intermediary buffer, wherein each instance is associated with a sub string of the string and comprises a state, a match length and a match offset for the associated substring;
   issuing, by a finite state machine, a hash request to a hash matcher for each instance, issuing a data request to an LSM (longest string matcher) according to a first reply sent by the hash matcher, and updating the state, the match length and the match offset of the instance according to a second reply sent by the LSM; and
   outputting, by the finite state machine, a result to a formatter according to the state, the match length and the match offset of each instance in the original order of the associated sub strings that appeared in the string, thereby enabling the formatter to compress the string accordingly.

2. The method of claim 1, wherein the steps for issuing a hash request to a hash matcher for each instance and issuing a data request to an LSM (longest string matcher) according to a first reply sent by the hash matcher comprises:
   updating the state of the instance with a no-match state when the first reply comprises a no-match message; and
   issuing the data request, updating the state of the instance with a data request state, updating the match length of the instance with a length of the sub string, and updating the match offset of the instance with an offset of the first reply when the first reply comprises a match message.

3. The method of claim 1, wherein the step of updating the state, the match length and the match offset of the instance according to a second reply sent by the LSM comprises:
   determining whether a length of the second reply is shorter than a maximum match length;
   updating the state of the instance with a partial match state and updating the match length of the instance with the length of the second reply when the length of the second reply is shorter than the maximum match length; and
   updating the state of the instance with a full match state, updating the match length of the instance with the maximum match length, and issuing a further data request corresponding to the instance to the LSM to continue the following-string comparison when the length of the second reply is not shorter than the maximum match length.

4. The method of claim 1, wherein the step of outputting a result to a formatter according to the state, the match length and the match offset of each instance in the original order of the associated substrings that appeared in the string comprises:
   outputting the result comprising a character of the instance when the state of the instance is a no-match state; and
   outputting the result comprising the match length and the match offset of the instance when the state of the instance is a partial match state.

5. The method of claim 1, wherein the finite state machine comprises a hash request procedure, a hash reply procedure, a data reply procedure and a retirement procedure,
   wherein the hash request procedure issues the hash request to the hash matcher for each instance,
   wherein the hash reply procedure issues the data request to the LSM according to the first reply sent by the hash matcher,
   wherein the data reply procedure updates the state, the match length and the match offset of the instance according to the second reply sent by the LSM, wherein the retirement procedure outputs the result to the formatter according to the state, the match length and the match offset of each instance in the original order of the associated substrings that appeared in the string.

6. The method of claim 5, wherein the hash request procedure and the retirement procedure are performed in parallel and have higher priorities than the others.

7. The method of claim 1, wherein the original order of the associated substrings that appeared in the string is controlled by a retirement pointer.

8. The method of claim 1, wherein the sub string has a length of 3.

9. An apparatus for accelerating hash-based compression, comprising:
   an intermediary buffer, storing a plurality of instances corresponding to a string to be compressed that is stored in a data buffer, wherein each instance is associated with a substring of the string and comprises a state, a match length and a match offset for the associated substring; and
   an FSM (Finite-State Machine) coupled to the intermediary buffer, issuing a hash request to a hash matcher for each instance, issuing a data request to an LSM (longest string matcher) according to a first reply sent by the hash matcher, and updating the state, the match length and the match offset of the instance according to a second reply sent by the LSM; and outputting a result to a formatter according to the state, the match length and the match offset of each instance in the original order of the associated sub strings that appeared in the string, thereby enabling the formatter to compress the string accordingly.

10. The apparatus of claim 9, wherein the FSM updates the state of the instance with a no-match state when the first reply comprises a no-match message; and issues the data request, updates the state of the instance with a data request state, updates the match length of the instance with a length of the sub string, and updates the match offset of the instance with an offset of the first reply when the first reply comprises a match message.

11. The apparatus of claim 9, wherein the FSM determines whether a length of the second reply is shorter than a maximum match length; updates the state of the instance with a partial match state and updates the match length of the instance with the length of the second reply when the length of the second reply is shorter than the maximum match length; and updates the state of the instance with a full match state, updates the match length of the instance with the maximum match length, and issues a further data request corresponding to the instance to the LSM to continue the following-string comparison when the length of the second reply is not shorter than the maximum match length.

12. The apparatus of claim 9, wherein the FSM outputs the result comprising a character of the instance when the state of the instance is a no-match state; and outputs the result comprising the match length and the match offset of the instance when the state of the instance is a partial match state.

13. The apparatus of claim 9, wherein the FSM comprises a hash request procedure, a hash reply procedure, a data reply procedure and a retirement procedure,
   wherein the hash request procedure issues the hash request to the hash matcher for each instance,
   wherein the hash reply procedure issues the data request to the LSM according to the first reply sent by the hash matcher,
   wherein the data reply procedure updates the state, the match length and the match offset of the instance according to the second reply sent by the LSM,
   wherein the retirement procedure outputs the result to the formatter according to the state, the match length and the match offset of each instance in the original order of the associated substrings that appeared in the string.

14. The apparatus of claim 13, wherein the hash request procedure and the retirement procedure are performed in parallel and have higher priorities than the others.

15. The apparatus of claim 9, wherein the intermediary buffer and the FSM are disposed in a compression accelerator and the compression accelerator is disposed outside of a processor core.

16. The apparatus of claim 9, wherein the original order of the associated substrings that appeared in the string is controlled by a retirement pointer.

17. The apparatus of claim 9, wherein the substring has a length of 3.

* * * * *